United States Patent
Eckard et al.

(12) 
(10) Patent No.: US 6,364,458 B2
(45) Date of Patent: *Apr. 2, 2002

(54) PIVOTED PRINTHEAD HANDLE WITH RECESSED REST POSITION

(75) Inventors: B Michael Eckard, Cardiff, CA (US); Jeffrey D Langford, Lebanon, OR (US); Gary P. McKittrick, Temecula, CA (US); James P. Kearns, Corvallis, OR (US); Thomas Cocklin, Ridgfield; Kenneth R Williams, Vancouver, both of WA (US)

(73) Assignee: Hewlett-Packard Company, Palo Alto, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/431,709

(22) Filed: Oct. 31, 1999

Related U.S. Application Data

(63) Continuation-in-part of application No. 29/100,784, filed on Feb. 18, 1999, now Pat. No. Des. 424,103.

(51) Int. Cl.⁷ .............................. B41J 2/01; B41J 2/175
(52) U.S. Cl. .......................................... 347/49; 347/87
(58) Field of Search .............................. 347/49, 86, 87, 347/50, 108

(56) References Cited

U.S. PATENT DOCUMENTS

| | | | | |
|---|---|---|---|---|
| 4,628,332 A | * | 12/1986 | Matsumoto | 347/49 |
| 4,833,491 A | * | 5/1989 | Rezanka | 347/43 |
| 4,907,018 A | * | 3/1990 | Pinkerpell et al. | 347/50 X |
| 5,269,438 A | * | 12/1993 | Kelsey | 220/766 |
| 5,988,804 A | * | 11/1999 | Kotaki | 347/87 |
| D424,103 S | * | 5/2000 | Eckard et al. | D18/56 |
| 6,155,667 A | * | 12/2000 | Eckard et al. | 347/33 |

OTHER PUBLICATIONS

Hewlett–Packard Company Press Release dated Apr. 20, 1998, regarding introduction in North America of the HP 2000C Professional Series Color Printer (3 Pages).

User's Guide for HP 2000C Professional Series Color Printer, No. C4530–90019, Hewlett–Packard Company (dated Jan. 1998).

\* cited by examiner

*Primary Examiner*—David F. Yockey

(57) ABSTRACT

An inkjet print cartridge is provided in a printer for removable installation in a carriage which typically holds a plurality of print cartridges of different color printing liquids. In order to minimize overall size of the printer and its carriage, a handle is pivotally mounted on a crown of the print cartridge to move from a down recessed position during normal printing and servicing operations to an upraised position for gripping while removing the printhead from a carriage chute. The handle forms a loop to facilitate gripping with the fingers and thumb, and in its preferred form is bendable in order to provide flexible yielding upon application of undesirable lateral or torsional forces during a removal procedure.

2 Claims, 12 Drawing Sheets

INSERT PRINTHEADS

PIVOTED PRINTHEAD HANDLE WITH RECESSED REST POSITION

RELATED APPLICATIONS

This application is a continuation-in-part of design application Ser. No. 29/100,784, filed Feb. 18, 1999, INKJET PRINTHEAD, by B. Michael Eckard et al., now U.S. Des. Pat. No. 424,103.

This application relates to the subject matter disclosed in commonly assigned co-pending U.S. patent application Ser. No. 09/431,712, filed Oct. 31, 1999 entitled "Datum Structure For Compact Print Cartridge" by Kenneth R. Williams et al.; U.S. patent application Ser. No. 09/431,710, filed Oct. 31, 1999 entitled "Compact Print Cartridge With Oppositely Located Fluid And Electrical Interconnects" by B. Michael Eckard et al.; U.S. patent application Ser. No. 09/431,711, filed Oct. 31, 1999 entitled "Unitary Latching Device For Secure Positioning Of Print Cartridge During Printing, Priming And Replenishment" by Tod S. Heiles et al.; and U.S. patent application Ser. No. 08/878,489 filed Jun. 18, 1997 entitled "Inkjet Pen Alignment Mechanism And Method" by Kenneth R. Williams et al., all of which are incorporated herein by reference.

BACKGROUND OF THE INVENTION

Various problems present themselves in design of current inkjet printers, Modern inkjet printers print at very high resolution, for example, 600 or even 1200 dots-per-inch (DPI). As resolution increases, droplet size typically decreases. With increased resolution and decreased dot size, it becomes more important that the pens be precisely located in the carriage. TO accomplish accurate positioning of the pen in the carriage, the pen typically has a set of physical X, Y, and Z datums that are seated against a corresponding set of datums in the carriage stall.

Modern inkjet printers typically print in color and have a plurality of color pens usually printing in cyan, magenta, yellow, and black. It is often desirable to provide a different pen for each color, so that if a single pen goes bad, only that pen need be replaced. However, each pen must be precisely aligned with the other colors, or the print quality of the printed images will be degraded. Therefore, the system must not only accommodate precision placement of the pens in the stalls, but precise alignment among the colors.

In addition to the mechanical positioning of the pens within the carriage, the pens must be fluidically connected to trailing tubes. The pens usually interface with some type of valve on the ends of the tubes. The pens make connection with these valves when they are inserted into the carriage stall. However, if the pen and valve interface is not correctly designed, the forces exerted on the pen during fluid interconnection will counteract the precision positioning of the datums, resulting in the pens being misaligned. The fluid interconnection mechanism must be designed so as to not act against the precise positioning resulting from the interaction of the datums.

Recent advances in printhead construction have allowed printheads to be designed to be a permanent or semi-permanent part of the printer, with separate ink cartridges that are fluidically connected in some fashion to the printhead.

Although the pens are preferably a permanent fixture in the printer, rather than being disposable, it is likely that many such pens will fail before the end of the life of the printer. Therefore, some provision must be made so that the pen can be removed and replaced with a new one. The mechanical datum system and fluid interconnect must also allow the new pen to be reliably and precisely positioned during such replacement. The system would be preferably designed so that installation and subsequent replacements could be done by a purchaser or by a field repair person away from factory conditions.

SUMMARY OF THE INVENTION

The invention provides an inkjet printing mechanism designed to receive an inkjet pen having a needle and a shroud surrounding the needle the shroud attached to the pen by means of a neck, the pen also having pen datums configured for positioning the pen within a printer carriage. The print includes a printer chassis and a media movement mechanism mounted to the chassis and construct to position a print medium in a print zone. A carriage is mounted to the chassis and is constructed to receive the pen and to position the pen over the print zone. The carriage has a notch configured to receive the neck when the stall receives the pen. A valve is movably attached to the carriage and is configured to move with respect to the carriage to be received by the shroud when the notch receives the neck. A septum is positioned on the valve and configured such that when the valve is received by the shroud, the septum is pierced by the needle. A set of carriage datums is formed in the stall and configured to interface with the pen datums. A latching mechanism is associated with the carriage and constructed to seat the pen datums against the carriage datums to finely position the pen with respect to the carriage.

The invention also provides a method of installing an inkjet pen into a carriage of an inkjet printing mechanism. The method includes the steps of: placing the pen in a stall of the carriage to guide a neck on the pen into a notch formed in the carriage: moving the pen further into the stall and by means of registration of the pen with walls of the pen stall, guiding a shroud on the pen over a valve; urging the pen further into stall until pen datums formed on the pen come into contact with carriage datums formed in the stall: and seating the pen datums against carriage datums to finely position the pen within the carriage;

The invention thus provides for reliable insertion of inkjet pens within their respective carriage stalls with successive guiding mechanism for aligning various parts of the pen with corresponding parts of the carriage. The invention allows for installation or replacements of pens to be reliably and easily done by a purchaser or by a field repair person away from factory conditions.

In order to provide for reliable removal of the print cartridge, a unique handle is provided for removable installation in a carriage which typically holds a plurality of print cartridges of different color printing liquids. In order to minimize overall size of the printer and its carriage, the handle is pivotally mounted on a crown of the print cartridge to move from a down recessed position during normal printing and servicing operations to an upraised position for gripping while removing the printhead from a carriage chute. The end of the handle preferable extends slightly beyond the perimeter of the print cartridge to make it easily accessible for moving to its upraised position. However, the handle in its down position is recessed below the top surface of the print cartridge and thereby avoids interference with the latching cover, as well as being recessed into both side walls of the print cartridge to avoid creating any obstruction during removal or installation procedures. The handle forms a loop to facilitate gripping with the fingers and thumb, and in its preferred form is bendable in order to provide flexible yielding upon application of undesirable lateral or torsional forces during a removal procedure.

DETAILED DESCRIPTION OF THE ILLUSTRATED EMBODIMENTS

Figure 1:
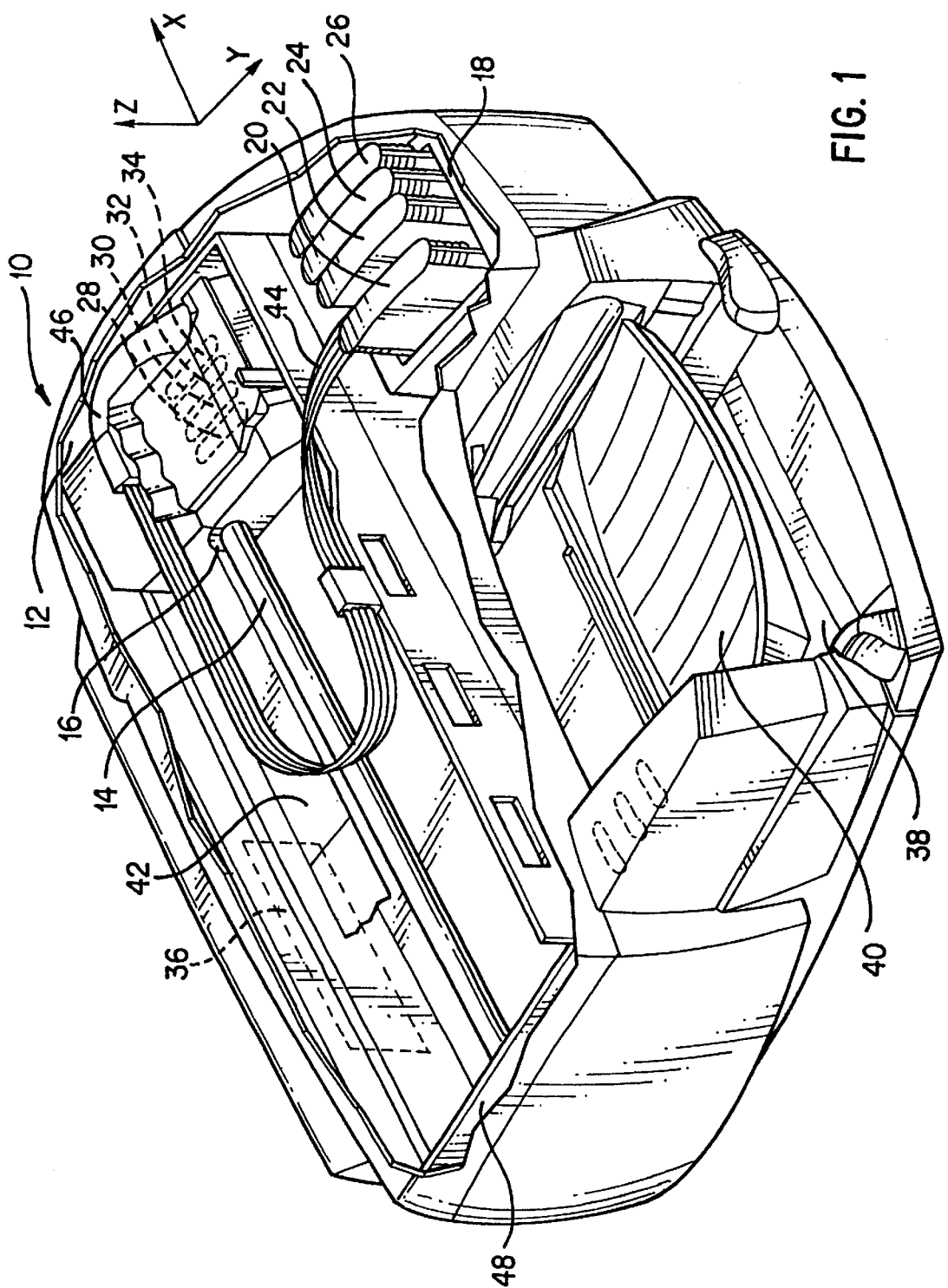
FIG. 1 is a perspective view of an inkjet printer having an ink replenishment system for multiple printheads removable mounted in a carriage.

FIG. 1 is a cutaway view of a printer 10 of the invention. Printer 10 includes a chassis 12, carriage rod 14, carriage 16, ink cartridge stall 18, ink cartridges 20, 22, 24, 26, printheads (pens) 28, 30, 32, 34 (shown in outline), controller 36 (shown in outline), input tray 38, and output tray 40. Controller 36 communicant with pens 28, 30, 32, 34 by means of a flex strip 42, in a manner well known in the art. Ink cartridge 20 holds black ink cartridge 22 holds cyan ink, cartridge 24 holds magenta ink, and cartridge 26 holds yellow ink. Similarly pen 28 prints black dots, pen 30 prints cyan dots, pen 32 prints magenta dots, and pen 34 prints yellow dots. Ink is fed from ink cartridges 20, 22, 24, 26 to pens 28, 30, 32, 34 by means of tube assembly 44. Tube assembly 44 connects with manifold 46, and inside manifold 46 the individual tubes carrying the four colored inks are separately routed to their respective valving mechanisms so that ink can be fed to the pens. Carriage 16 is shown in FIG. 1 in its "home" position at the right side of the print zone. The print zone resides between this home position and the left side 48 of chassis 12.

Carriage 16 rides along carriage rod 14 and traverses in the direction labeled X back and forth to thereby scan the pens across the print zone as dots are laid down on the page in a dot matrix pattern. For this reason, the direction X is commonly referred to as the carriage axis or scan axis.

After a print swath is complete, the paper or other print media is incrementally moved in the direction labeled Y, so that another print swath can be printed. Subsequent contiguous swaths are printed to print entire pages of text or images in a manner well known in the art. The direction orthogonal to directions X and Y will be referred to herein as the Z axis. After a page of information is printed, the page is ejected onto the output tray 40, and a new sheet is "picked" from the input tray so that it can be printed on.

Figure 3:
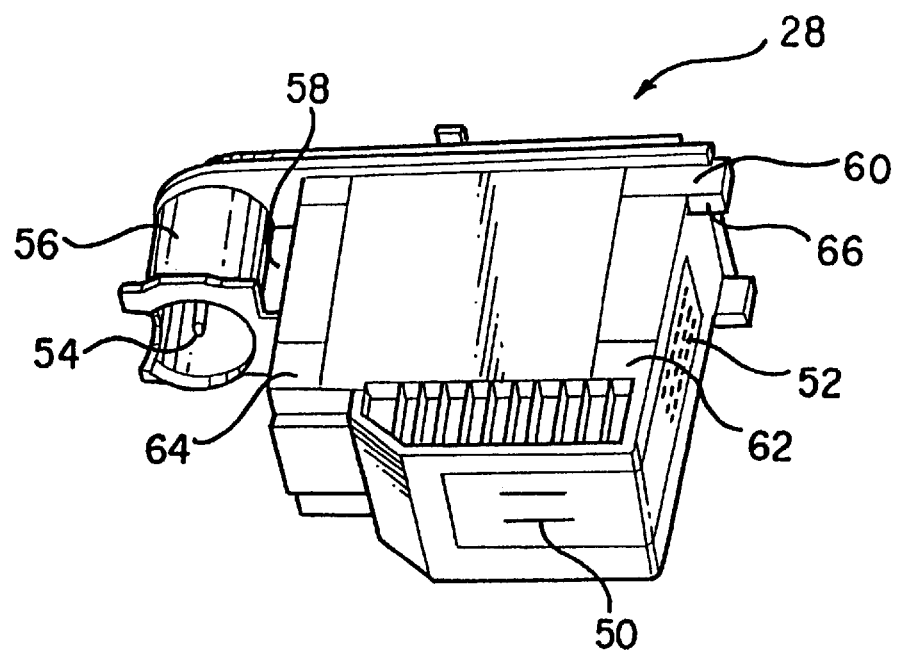
FIGS. 3 and 4 are bottom perspective views of one version of a print cartridge incorporating features of the invention.
Figure 4:
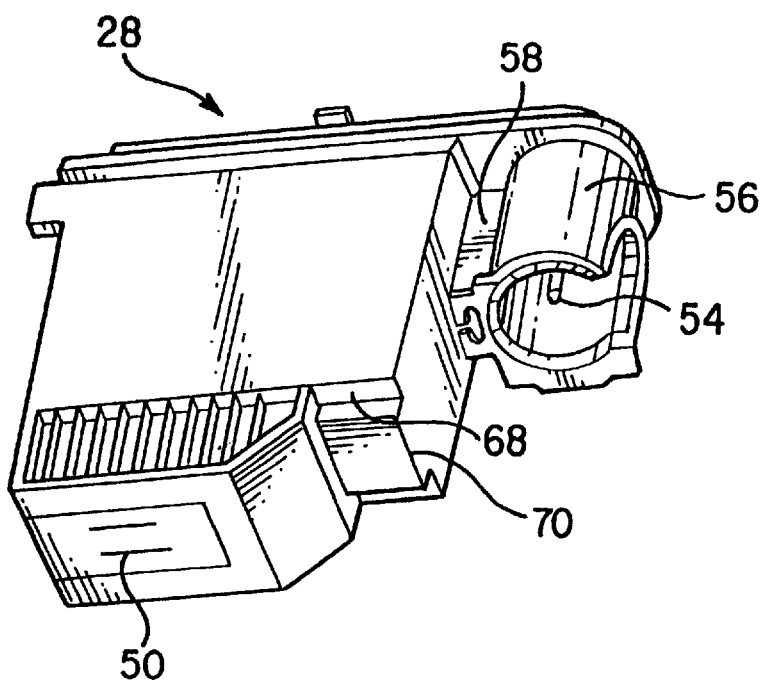

FIGS. 3 and 4 illustrate pen 28 in detail, and is typical of pens 28, 30, 32, 34. This pen includes printhead nozzles 50, electrical interconnect pads 52, fluid interconnect needle 54, shroud 56, and neck 58. Pen 28 has X datums 60, 62, 64; Z datums 66 and 68; and Y datum 70. Contact pads 52 interface with a set of matching contact pads in the printer so that the printer provide firing signals to the pen. Based on these firing signals, droplets are ejected from nozzles 50. Needle 54 interfaces with a septum, described later, to provide a supply of ink to the pen. Shroud 56 covers and protects needle 54. Both shroud 54 and neck 58 serve to guide the needle into its interface with its septum. These functions are described more completely below.

Figure 2:
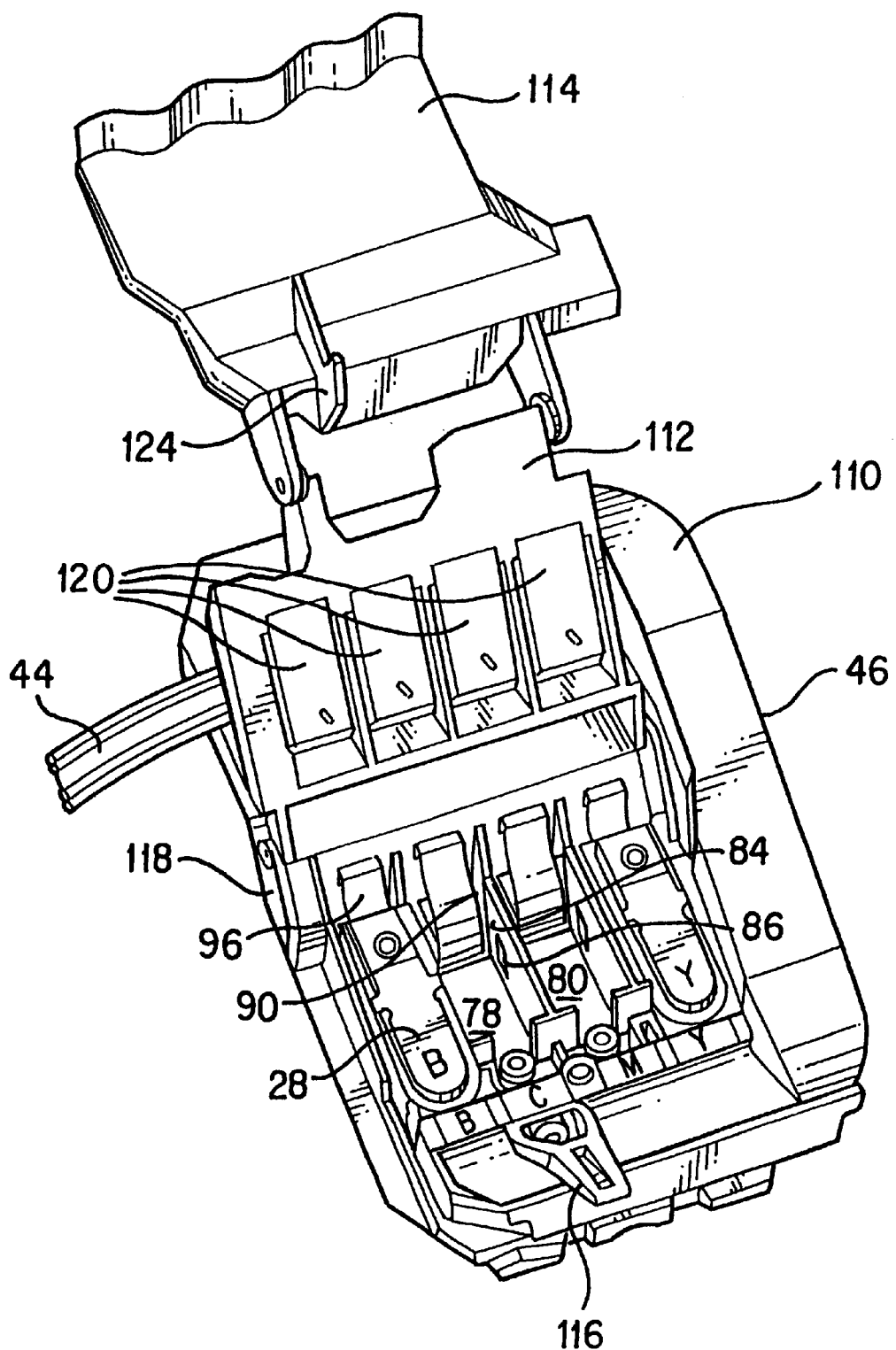
FIG. 2 shows one embodiment of a carriage incorporating features of the invention, with a latching device in open positioned black and yellow print cartridge in the carriage chutes with their print cartridges handles down.
Figure 8:
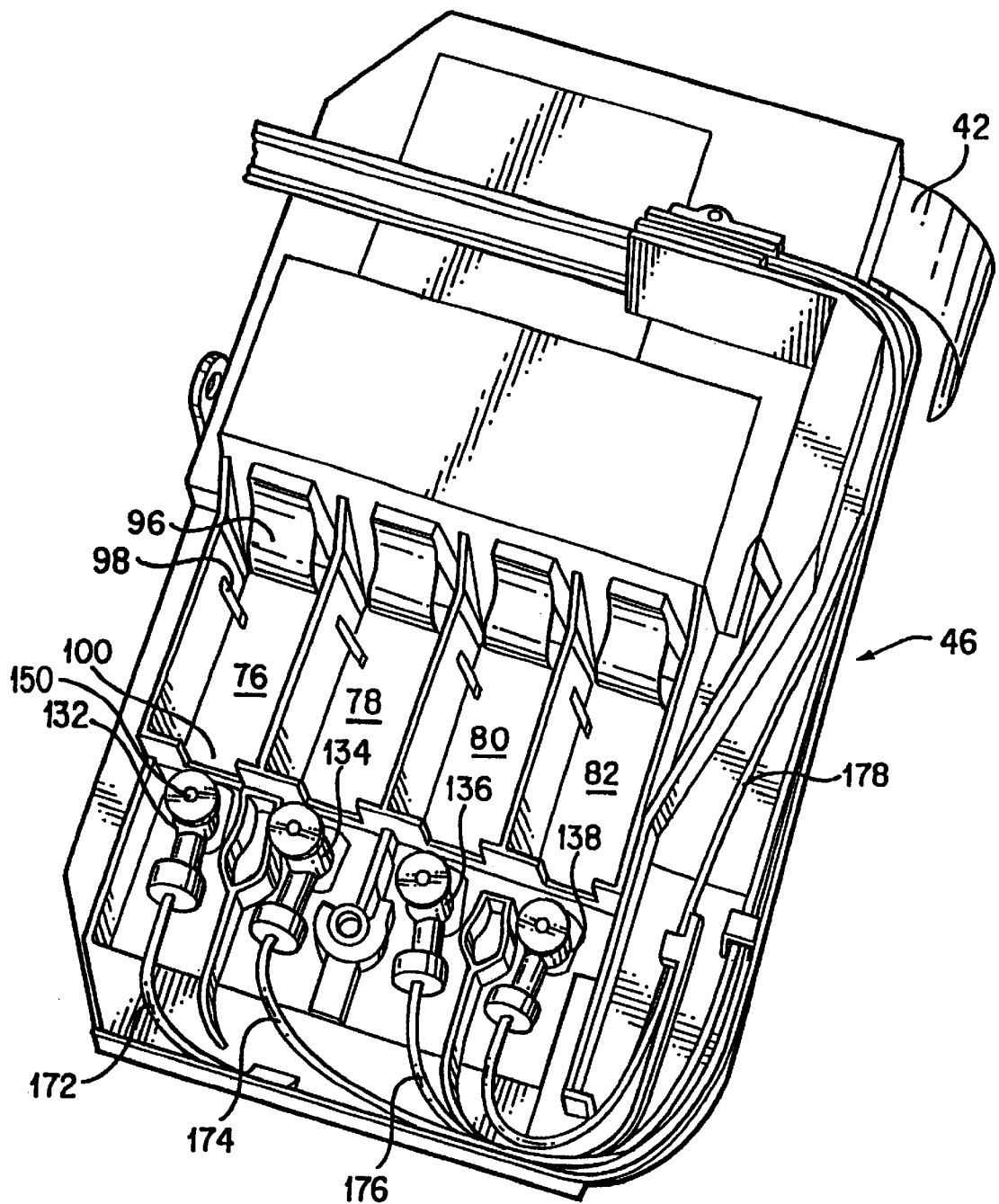
FIG. 8 is a partially cut-away top view of the carriage with the print cartridges removed, showing the ink replenishment tube routing.

FIGS. 2 and 8 illustrate details of carriage 16, and includes pen stalls 76, 78, 80, 82. Pens 28, 30, 32, 34 are installed into stalls 76, 78, 80, 82, respectively. Stall 76 is typical and will be described in detail. Stall 76 includes X, Y, and Z datums that correspond directly with the X, Y, and Z datums on pen 28, described in reference to FIGS. 3 and 4. For example, in FIG. 2, X datums 84, 86 and Z datum 90 are visible in stall 78, which datums correspond to the datums on pen 30. Stall 76 also includes contact pads 96 and notch 100. A spring is positioned behind contact pads 96 to bias the contact pads outward, or in the direction of the notch 100.

As pen 28 is installed into stall 76, neck 58 fits into notch 100. As the pen is further installed, spring 98 urges the pen toward the right (as viewed in FIGS. 3 and 4) to bias X pen datums 60, 60, and 64 against the X carriage datums to position the pen in the X direction within the carriage. Carriage contact pads 96 engage with pen contact pads 52, so that the printer can communicate with the pen. Also, because of the spring behind contact pads 96, Y pen datum 70 is urged against its carriage datum to position the pen in the Y direction. By means of a latch mechanism described below, Z pen datums 66 and 68 are urged against the Z carriage datums to position the pen in the Z direction. Thus the pen is precisely positioned in the X, Y, and Z directions with respect to carriage 16 so that droplets are accurately deposited on the page in their intended location.

FIG. 2 and FIGS. 5–7 illustrate details of the latching mechanism that latches pens 28, 30, 32, and 34 into their respective stalls so that the pen datums are all firmly held into position against their respective carriage datums. This mechanism includes a carriage chassis 110, latch 112, handle 114, and pivot arm 116. Carriage chassis rides along carriage rod 14 at hole 118. A set of contact arms 120 is pivotally connected to latch 112, as shown, and a spring (not shown)

is mounted behind each of contact arms 120 to urge contact arms 120 outward or away from latch 112. Handle 114 includes a hook 124, designed to interlock with pivot arm 116, as described below. Latch 112 is pivotally attached to carriage chassis 110, and handle 114 is in turn pivotally attached to latch 112, as shown. Pivot arm 116 is pivotally attached to carriage chassis 110, as shown.

Figure 5:
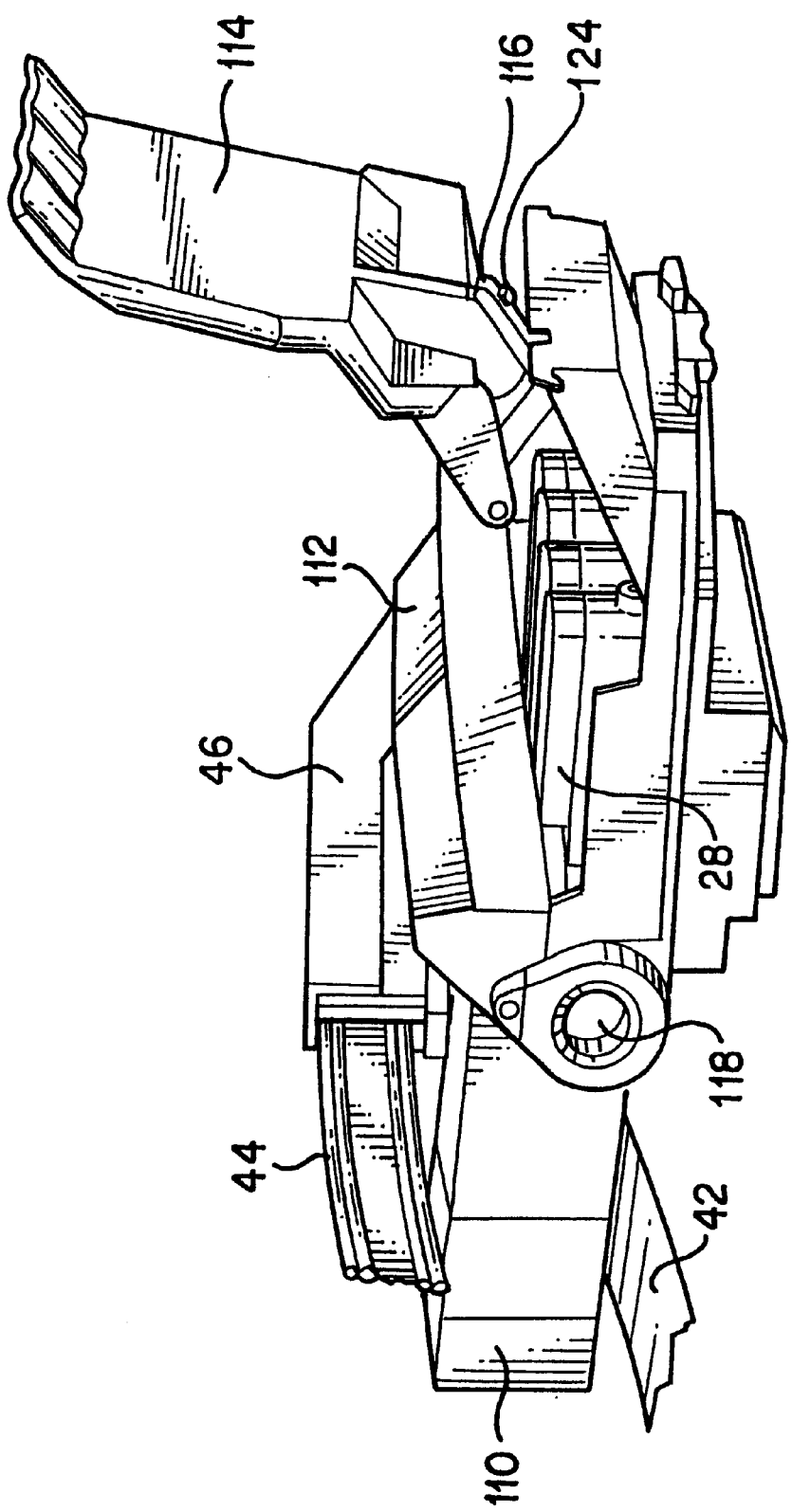
FIG. 5 is a perspective view showing four print cartridges in the carriage chutes, with the latching device in intermediate position.

FIG. 2 shows the latch mechanism in its fully open position, with latch 112 flipped back toward the rear of the printer and handle 114 rotated back behind latch 112. Pivot arm 116 is rotated forward out of the way. With the latch mechanism in this position, pens can be installed or exchanged. FIG. 5 shows the latch mechanism in a second position in which latch 112 is rotated forward (clockwise as viewed in FIG. 5) so that contact arms 120 are pushing against the pens. Handle 114 is rotated so that hook 124 is interlocked with pivot arm 116. Handle 114 is held by the user to move the mechanism from the orientation shown in FIG. 2 to the one shown in FIG. 5. After hook 124 is interlocked with pivot arm 116, the user rotates handle 114 back toward the rear of the printer (or counterclockwise as viewed in FIGS. 2, and 5–7). As the handle is thus rotated, latch 112 will be urged downward so that contact arms 120 are urged against the pens by means of springs mounted behind each contact arm. As the user rotates handle 114 toward the position shown in FIG. 7, he will feel a force, resulting from the springs behind contact arms 120, urging the handle to rotate back to the orientation shown in FIG. 5.

Figure 6:
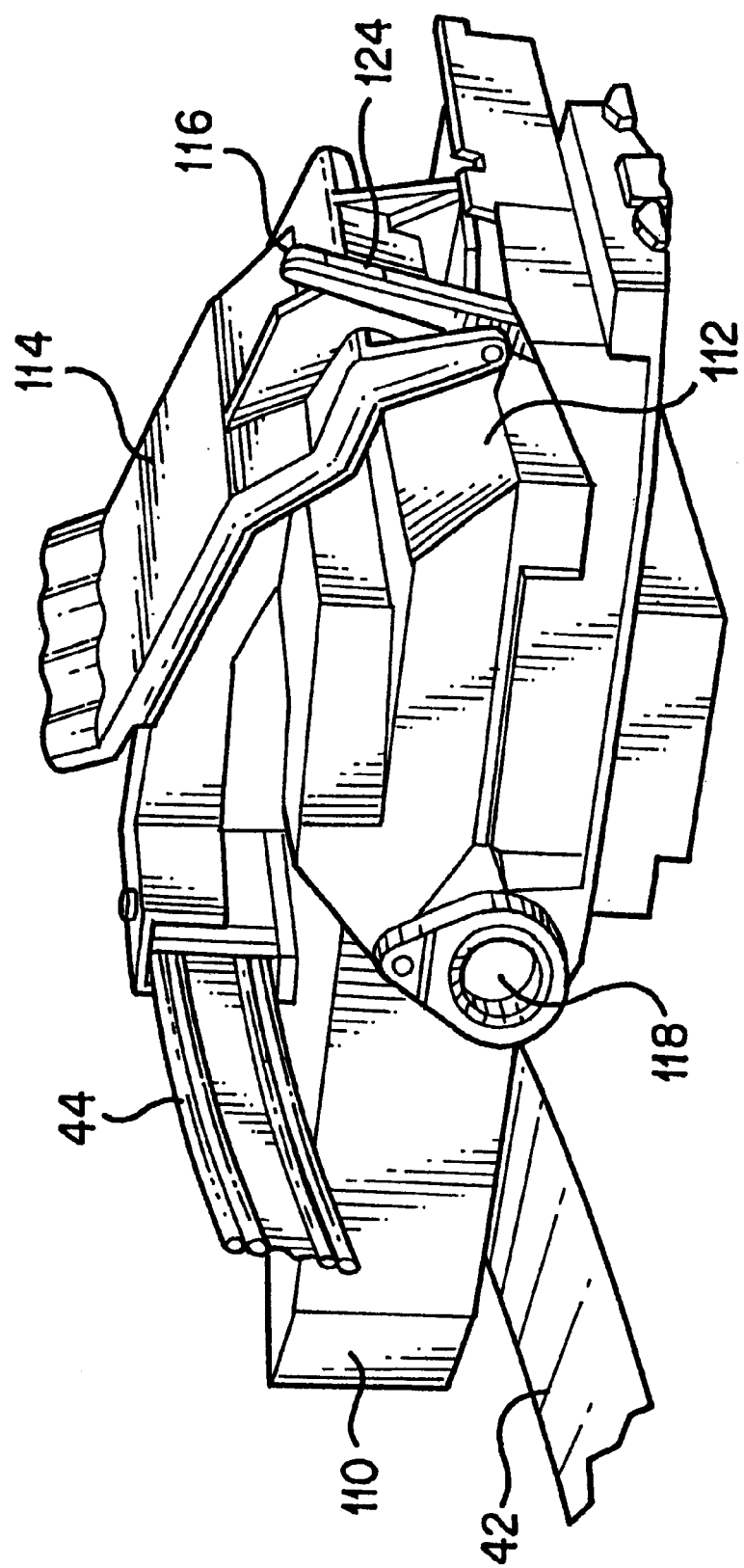
FIG. 6 shows the cover down on the print cartridges, with the latching device almost in closed position.
Figure 7:
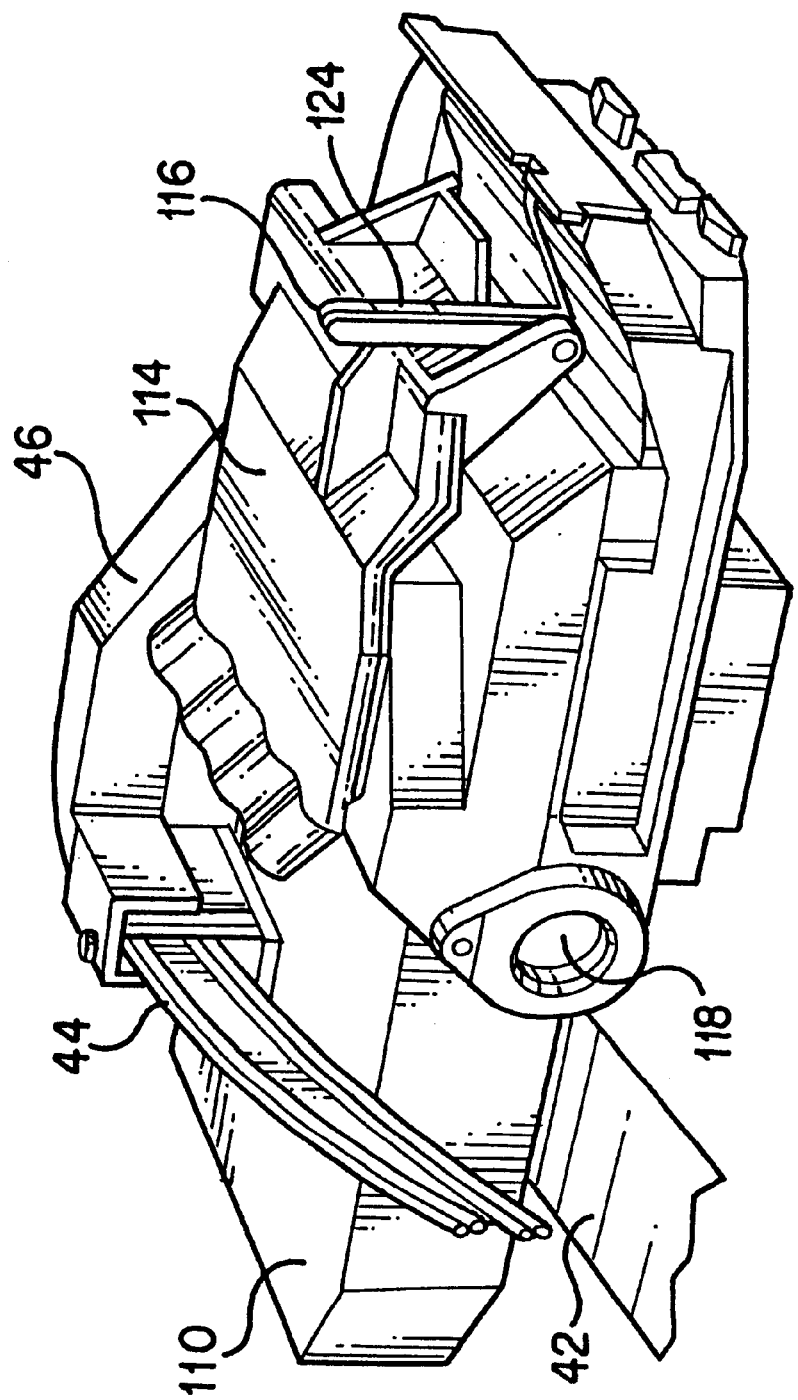
FIG. 7 shows the carriage with the latching device in closed position.

When the mechanism reaches the orientation shown in FIG. 6, the forces reach an equilibrium, and in this position, the mechanism may therefore be said to be moving through to an a over-center position. As the user continues to rotate handle 114 toward the position shown in FIG. 7, the forces resulting from the springs behind contact arms 120 will urge handle 114 to continue rotating, until the handle is in its position shown in FIG. 7. Thus the orientation shown in FIG. 7 is in a stable energy state, and the handle is therefore in a locked position so that the pens are firmly held in place. The motion of the latching mechanism from the position shown in FIG. 5 to the position shown in FIG. 7 may be referred to as a latching motion. When it is desired to replace a pen, the user will rotate handle 114 back through the over-center position (FIG. 6), and back to the position shown in FIG. 5. The user will then rotate the handle 114 and latch 112 back to the position shown in FIG. 2.

In accordance with the design objectives, manifold 46 has various barriers, walls, and clips to channel the ink tubes. Tube 172 carries black ink, tube 174 carries cyan ink, tube 176 carries magenta ink, and tube 178 carries yellow ink. Each of the tubes has a different length, and the different lengths of the tubes assists in the assembly of the tubes and valves in the manifold 46. The valves 132, 134, 136, 138 are connected to tubes 172, 174, 176, 178, respectively before the tubes are inserted in the manifold.

The process for installing pens is now described. This description is given with regard to pen 28, with the understanding that the process for installing the other pens is the same. The user grasps one pen 28 with the needle and printing nozzles facing down as shown in FIG. 3 and begins to position it within its stall 76. Pen 28 is positioned so that pen contact pads 52 are closest to carriage contact pads 96. Spring 98 has a high spring tension and urges pen 28 to the right as viewed in FIG. 2. Because of the spring behind carriage contact pads 96, contact pads 96 also urge pen 28 toward the front of stall 76 (i.e. toward notch 100). Because of the frictional forces between the pen and the walls of the stall the user will need to use some force to push the pen downward into its stall.

As the user further pushes pen 28 into its stall, neck 58 will engage within and interface with notch 100. As this happens, notch 100 positions shroud 56 over valve 132. As the user further pushes the pen down, shroud 56 will engage with valve 132 to locate valve 132 within shroud 56 and also positions needle 54 above septum and in position to pierce slit 150.

The other pens 28, 30, and 32 are similarly installed. At this point the latching mechanism is used, as described in reference to FIGS. 2, 5, 6 and 7 to latch the pens into their stalls and to firmly position the pen datums against their respective carriage datums. At this point, the pens are precisely located in their stalls in the carriage and the fluid interconnect is made, so that the printer is ready to print.

The recent embodiment of the unique compact print cartridge in its presently preferred embodiment is employed in a large format rollfeed/sheet feed printer. While some of the features are closely similar to the earlier embodiment shown in FIGS. 3–4 and other related FIGS., new reference numerals will be used for clarification. In that regard, referring to FIGS. 15–18, the print cartridge 602 includes a body 603 which forms an internal reservoir and a lower snout 604 which extends more than half the distance across a lower end of the internal reservoir and defines a nozzle area 606 from which ink is applied to media. An upper crown 608 includes on one end (generally above the snout) a leak test hole 610, a slanted vector force contact area 612, and a vent hole 614 to the valve-actuator bellows surrounded by a primer seal area 615. The other end of the crown includes a lid 616 which covers an enclosed passage connecting the fluid interconnect 618 with an inlet valve to the internal reservoir, and a peripheral ledge 619 which provides a recess for receiving a handle 620 in its down position. The fluid interconnect includes a shroud 622 surrounding a downwardly projecting needle 623 which is protected by a plug 624 during shipment and before installation in the carriage. A color keying component 626 is used to assure that each print cartridge is installed in its proper chute or slot in the carriage.

The datums on the print cartridge include three X datums 630, 632, 634, one Y datum 636 and two Z datums 638, 640 as shown in the FIGS. which are arranged to assure proper and secure positioning against matching datums surfaces in the carriage. In contrast to some earlier print cartridges, these datums need not be machined in order to avoid mis-alignment.

The handle 620 includes enlarged hubs 650 which are pivotally mounted on pins 652. The hubs are at each end of two small diameter legs 654 which join together to form a thickened loop 656 having an outwardly extending tab 658.

Figure 9:
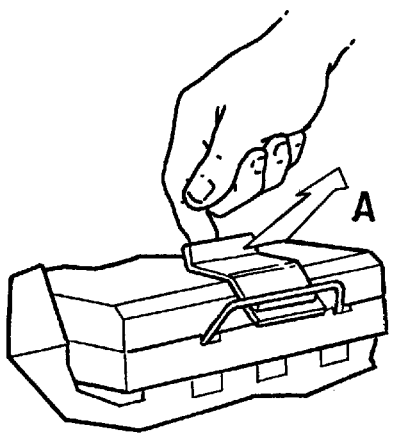
FIG. 9 shows the manner of initially unlatching a cover on the carriage for a wide format inkjet printer.
Figure 10:
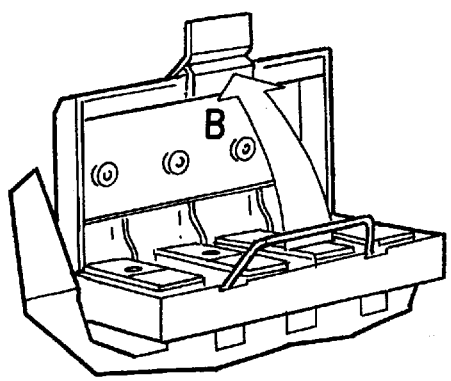
FIG. 10 shows the cover in open position allowing access to the printheads.
Figure 11:
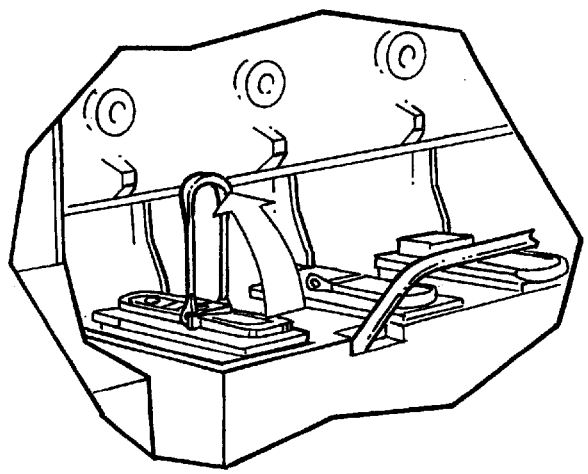
FIG. 11 shows the handle moved from its down recessed position to an upraised position.
Figure 12:
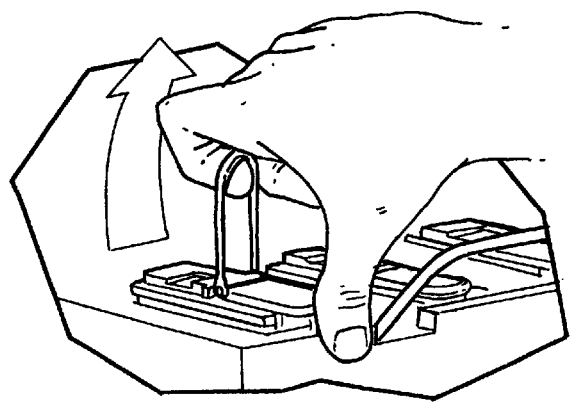
FIG. 12 shows the upraised handle gripped for lifting the print cartridge from the carriage chute.
Figure 13:
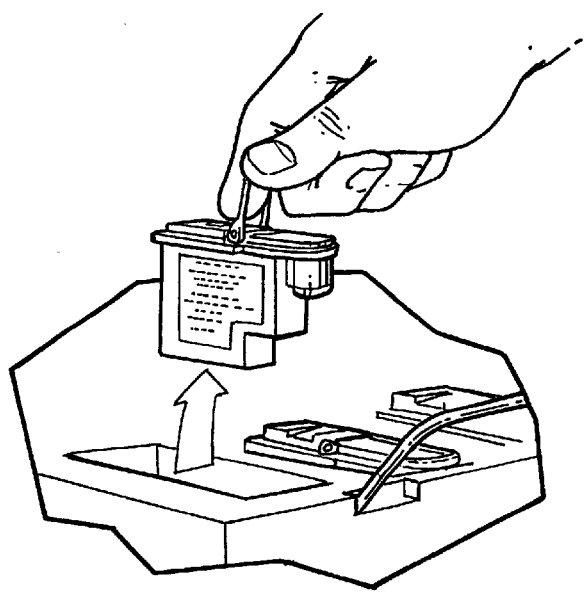
FIG. 13 shows the print cartridge removed from the carriage chute by gripping the upraised handle without hold the print cartridge itself.
Figure 14:
FIG. 14 shows a display panel indicating the individual installation status of four print cartridges.
Figure 15:
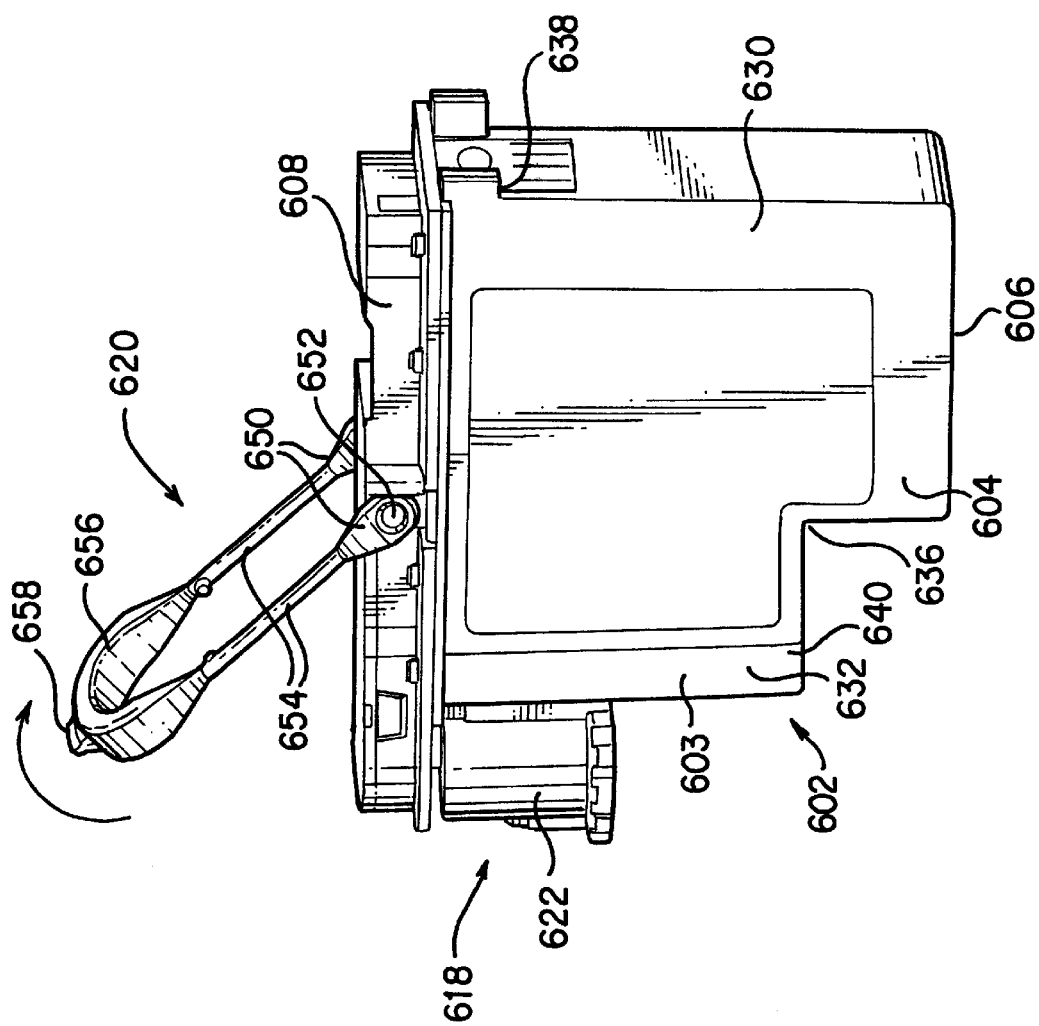
FIG. 15 is a perspective view showing the handle in partially upraised position.
Figure 16:
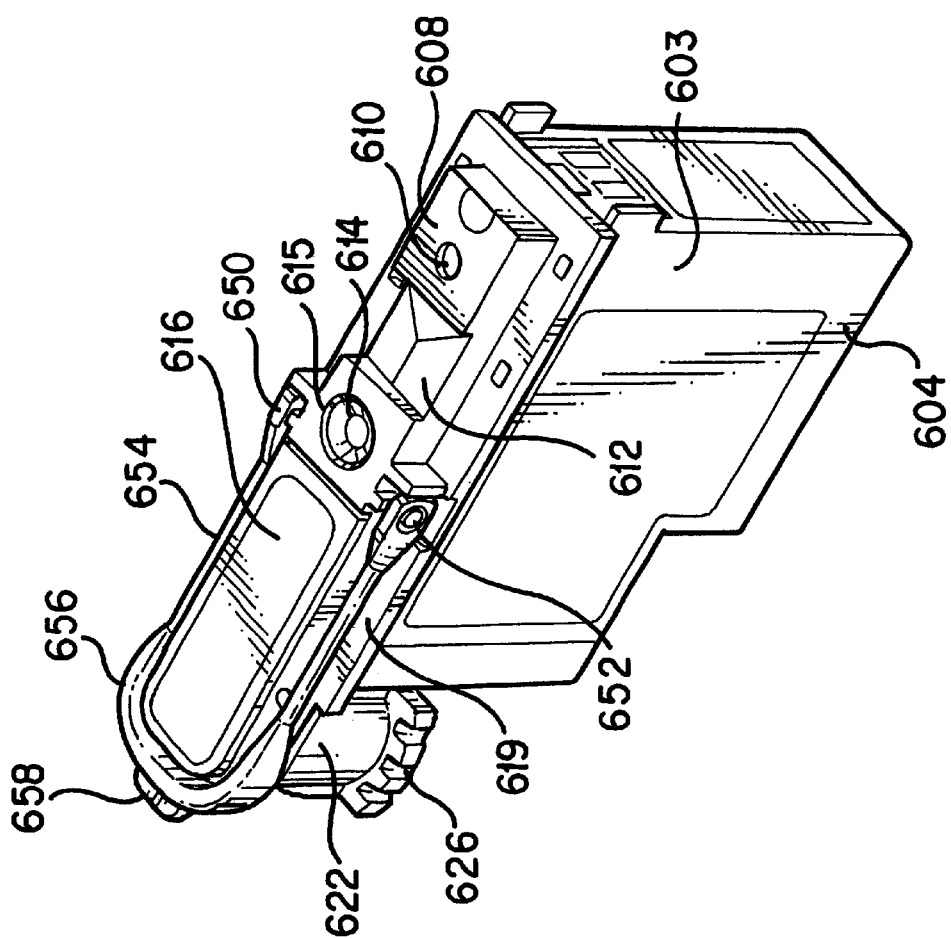
FIG. 16 is a top perspective view showing the handle in recessed position against the crown of the print cartridge.
Figure 18:
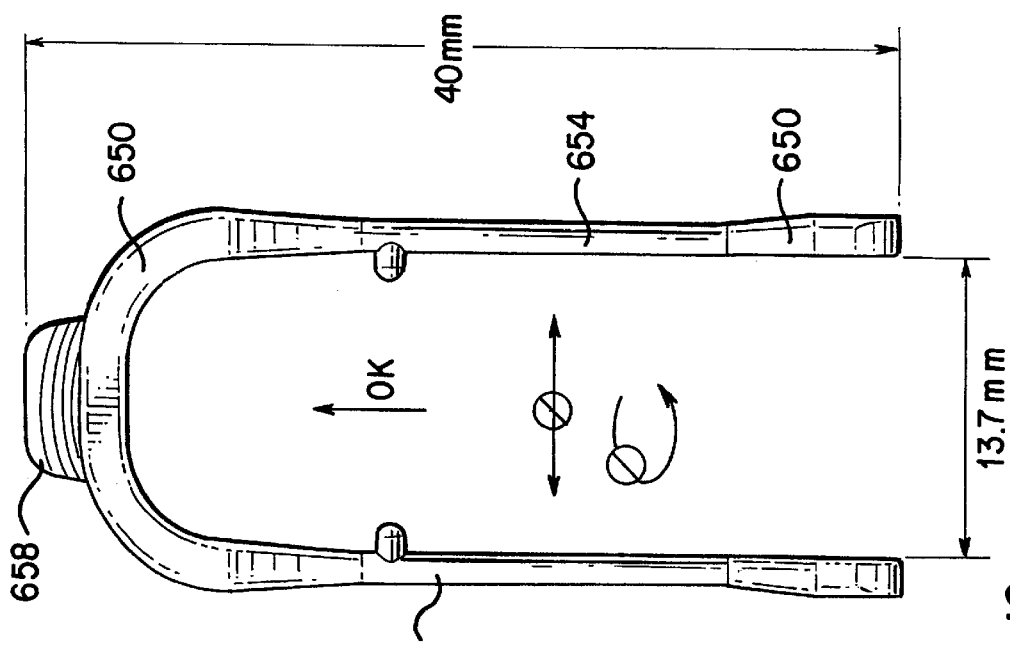
FIG. 18 is a front view of the handle.
Figure 17:
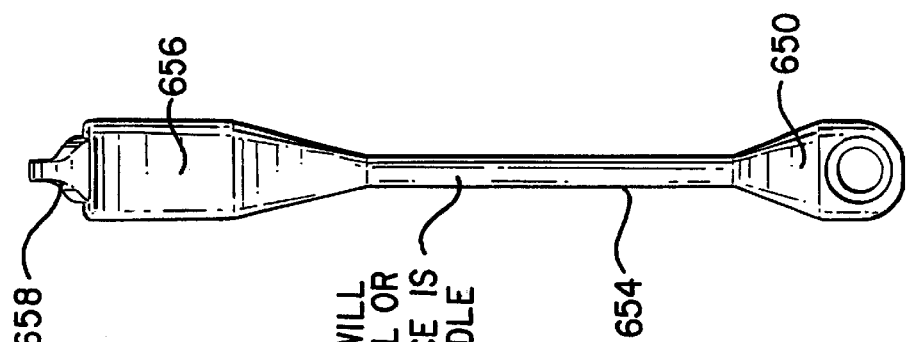
FIG. 17 is a view of the handle.

FIGS. 9–14 illustrate the removal of an installed print cartridge from a carriage on a wide format inkjet printer. FIG. 9 shows the manner of initially unlatching a cover on the carriage. FIG. 10 shows the cover in open position allowing access to the printheads. FIG. 11 shows the handle moved from its down recessed position to an upraised position. FIG. 12 shows the handle gripped for lifting the print cartridge from the carriage chute. FIG. 14 shows the print cartridge removed from the carriage chute by gripping the upraised handle without having to hold the print cartridge itself. FIG. 14 shows a display panel indicating the individual installation status of four print cartridges.

It will be understood from the foregoing description and accompanying drawings that the print cartridge of the present invention provides a set of unique mechanical interface features that enable high performance printheads (sometimes referred to herein as "pens") designed to receive ink from separable external ink supplies while maintain a compact printer form factor. This feature set includes a novel combination of outside form factor, datum arrangement, latching, and handle which have been matched with corresponding features in the carriage to facilitate print cartridge installation, printing, servicing, removal and replacement while maintaining predictable and precise tolerances around the required fluid and electrical interconnections.

The lower height dimension serves to minimize the overall printer height, and allows a printer to be stored and/or used in typical nineteen inch rack mountable hardware. The minimal width serves to diminish the eight-times multiplier effect caused by a four printhead carriage overtravel on each end of the carriage scan. Depth has the least impact on the product size, and in fact the additional depth helps to provides better theta-z rotational control of the print cartridges mounted in the carriage.

Weight is important to minimize motor force requirements which has a direct impact on product cost. Also, printers using heavier print cartridges often generate objectionable shaking and vibrations when used on a high performance carriage which has an increased range of acceleration/deceleration at both ends of the scan.

The following table shows the changes for the new 600 dpi printhead of the present invention as compared to a typical previous 600 dpi printhead of Hewlett-Packard:

TABLE I

| # of Nozzles | Height | Width | Depth | Weight |
|---|---|---|---|---|
| 300 | 93 mm | 18.7 mm | 60 mm | 113 gms |
| 512 | 51 | 15.9 | 70 | 38 gms |

The improved datum arrangement has been developed in order to successfully implement the small form factor and to assure precise positioning during the life of a semi-permanent print cartridge and printhead. In this regard, the datum arrangement minimizes undesirable theta-z variations. Also, the datum locations are spaced apart as much as possible from the printhead itself to minimize any adverse effect of datum engagement generated particles on successful ink ejection from the printhead.

The position of the latch force vector minimizes alignment variation for a small form factor print cartridge. The latch applies a force of the top of the print cartridge that passes between the fluid and electrical connections to the printhead. The fluid and electrical connections are made at opposing ends of the print cartridge. The latch force vector is applied at a point between these connections, and in a preferred embodiment is applied at a point that is proximate to the intersection of a plane that bisects the nozzle plane and passes through the top of the print cartridge. The exact predetermined location for applying the latch force minimizes the overall force required to accurately position this small form factor print cartridge. Moreover, if there is a printhead/media crash that knocks the print cartridge out of alignment, the latch mechanism in combination with the datums will tend to correctly reseat the print cartridge in that carriage.

The handle is designed to enable removal of the print cartridge from the carriage without damaging either the electrical interconnect or the fluid replenishment interface. The size and shape of the handle is designed to avoid adding to any of the print cartridge dimensions, while at the same time providing ease of use. If a user by mistake leaves the handle in its upraised position and forgets to rotate it back to the down position, the handle will tend to automatically return it to the down position.

The flexible character of the handle allows substantial force to be applied to the print cartridge only in a non-destructive and intended direction. Otherwise there is a risk of damaging the print cartridge or carriage which would result in ink spillage or other damage which would preclude the printer from operating properly. If a force is applied in the wrong direction while removing the print cartridge from the carriage, the legs of the handle will buckle. This flexible or yielding handle design also protects the printer if the customer leaves the handle in its upraised lifting position when installed in the carriage chute, since it will safely return to its partially recessed down position when the carriage latching device is closed.

By having the handle rest in a recessed position relative to the overall perimeter of the print cartridge and fluid interconnect, there is no increase to the outside dimensions of the print cartridges. It also is allowed to rotate downwardly in only one direction thereby avoiding interference with the application of the vector force by the latching cover.

The handle is a different color from the print cartridge body and is therefore very intuitive to use. It provides feedback to the user since the handle will begin to buckle if the print cartridge is being pulled, pushed or twisted in the wrong direction. The handle is also designed to discourage users from touching easily damaged electrical contacts as well as keeping them away from the fluid interconnects or the nozzle plate which may have residual ink on them. In view of the foregoing it is clear that the handle is the only logical and feasible way of removing the print cartridge when it is properly installed in the carriage chute. Without the handle a user would need a special tool to remove a print cartridge. Although alternative methods to loosen an installed print cartridge could be incorporated in the carriage, it is believed that they would require a user to grip or touch the body of the print cartridge during or after removal. This could potentially cause ink to rub or spill on the user or perhaps damage the print cartridge. Also, alternate approaches would necessarily require space on the carriage which in turn would probably add to the overall size of the printer.

Accordingly it is believed that this pivotally attached not type of handle is an important improvement over prior handles that were molded as part of the print cartridge bodies. Such molded handles on previous print cartridges added to their outside dimensions, were not necessarily intuitive in their use, and did not provide safeguards against excessive force being applied to the print cartridge or carriage in a detrimental way.

While particular exemplary embodiments have been shown and described, it will be appreciated by those skilled in the art that various changes, substitutions and improvements can be made without departing from the spirit and scope of the invention as set forth in the following claims.

We claim:

1. An inkjet printing system comprising:
   a printer frame;
   a carriage on said frame including a chute for holding print cartridges;
   a printhead unit removably mounted on said carriage in said chute, and having an electrical interconnect for receiving control signals and a fluid interconnect for receiving printing liquid from a supply external to said printhead;

a handle pivotally attached to said printhead unit and movable between a down position adjacent an outer surface of said printhead unit to an upraised position to be gripped for purposes of removing said printhead unit from said chute and providing disengagement of said electrical interconnect and of said fluid interconnect, said handle formed from two legs joined together by a curved portion, with each of said two legs being pivotally attached to said printhead unit, and wherein a portion of each of said legs has a minimum diameter which is less than a minimum diameter of said curved portion to allow said legs to be flexible when lateral force is applied to said handle.

2. The printing system of claim 1 wherein a portion of each of said legs has a minimum diameter which is less than said minimum diameter of said curved portion of said loop to allow said legs to be flexible when torsional force is applied to said handle.

* * * * *

UNITED STATES PATENT AND TRADEMARK OFFICE
CERTIFICATE OF CORRECTION

PATENT NO.      : 6,364,458 B2
DATED           : April 2, 2002
INVENTOR(S)     : Eckard et al.

It is certified that error appears in the above-identified patent and that said Letters Patent is hereby corrected as shown below:

<u>Title page, Item [54] and Column 1, lines 1-2,</u>
Please delete the title and insert the following title:
-- INKJET PRINTING SYSTEM WITH PRINTHEAD UNIT HAVING HANDLE WITH FLEXIBLE LEGS --

Signed and Sealed this

Sixteenth Day of December, 2003

JAMES E. ROGAN
*Director of the United States Patent and Trademark Office*